United States Patent
Borders

(10) Patent No.: US 7,117,410 B2
(45) Date of Patent: Oct. 3, 2006

(54) DISTRIBUTED FAILURE ANALYSIS MEMORY FOR AUTOMATIC TEST EQUIPMENT

(75) Inventor: Grady Borders, West Hills, CA (US)

(73) Assignee: Teradyne, Inc., Boston, MA (US)

( * ) Notice: Subject to any disclaimer, the term of this patent is extended or adjusted under 35 U.S.C. 154(b) by 553 days.

(21) Appl. No.: 10/324,707

(22) Filed: Dec. 20, 2002

(65) Prior Publication Data

US 2004/0153901 A1  Aug. 5, 2004

(51) Int. Cl.
*G11C 29/04* (2006.01)
*G11C 15/04* (2006.01)
*G01R 31/18* (2006.01)

(52) U.S. Cl. .................. 714/723; 714/724; 365/200
(58) Field of Classification Search ............... 714/724, 714/710, 711, 718, 723; 365/200–201
See application file for complete search history.

(56) References Cited

U.S. PATENT DOCUMENTS

| | | | |
|---|---|---|---|
| 6,138,257 A * | 10/2000 | Wada et al. ............... 714/724 |
| 6,286,120 B1 | 9/2001 | Reichert et al. |
| 6,389,525 B1 | 5/2002 | Reichert et al. |
| 6,449,741 B1 * | 9/2002 | Organ et al. ............... 714/724 |
| 6,536,005 B1 | 3/2003 | Augarten |
| 6,553,529 B1 | 4/2003 | Reichert |
| 6,567,941 B1 * | 5/2003 | Turnquist et al. .......... 714/724 |
| 6,574,764 B1 * | 6/2003 | Krech et al. ............... 714/738 |

OTHER PUBLICATIONS

NN84045996 IBM TDB "Universal Physical Memory Bit Fal Map" Kurth etal. vol. 26 No. 11 Apr. 1984.*
"Test Response Compression and Bitmap Encoding for Embedded Memories in Manufacturing Process Monitoring" by Chen et al. This paper appears in: International Test Conference Proceedings. Pub Date: 2001 pp. 258-267 INSPEC Accession No. 7211343.*

* cited by examiner

*Primary Examiner*—Cynthia Britt
(74) *Attorney, Agent, or Firm*—Christopher R. Balzan, Esq

(57) ABSTRACT

A failure analysis memory is disclosed for use with a semiconductor tester for storing bit image failure information relating to a memory-under-test. The semiconductor tester has a plurality of channel cards disposed proximate the memory-under-test. The failure analysis memory includes a memory controller and a plurality of memory units disposed in communication with the memory controller. The memory units are distributed on the channel cards.

14 Claims, 4 Drawing Sheets

DISTRIBUTED FAILURE ANALYSIS MEMORY FOR AUTOMATIC TEST EQUIPMENT

FIELD OF THE INVENTION

The invention relates generally to automatic test equipment, and more particularly failure analysis memory architectures for automatic test equipment applications.

BACKGROUND OF THE INVENTION

Test is an important step in the manufacture of semiconductor devices. Typically performed at both the wafer and packaged-device levels, test is normally carried out with sophisticated automatic test equipment. The equipment, often called a tester, applies test signals to each device, and compares detected output signals to expected signals. Failing devices are then discarded or repaired, if possible.

When testing memory devices, or other semiconductor devices with embedded memory (such as logic or SoC devices), the tester often includes a failure analysis memory, or catchRAM. The catchRAM stores failure information in such a manner that enables a bit-image representation of the device-under-test. This conveniently allows the test engineer to visually identify failures detected in the memory device cell array.

Recently, catchRAM architectures have progressed from compact, fast and expensive SRAM-based constructions, to large but inexpensive SDRAM implementations. DRAMS are typically much slower than SRAMs on a one-to-one comparison, but when banked, provide similar performance. One proposal for a DRAM catchRAM is described in U.S. patent application Ser. No. 09/426,486, titled "High-Speed Failure Capture Apparatus and Method For ATE", assigned to the assignee of the present invention, and expressly incorporated herein by reference.

Although conventional DRAM-based catchRAMs provide significant cost benefits without sacrificing overall performance, the additional device banks, together with the increasing capacities of the devices-under-test, generally result in the memory being overly large for practical placement near the devices-under-test (DUTs). Consequently, conventional DRAM-based catchRAMs are generally centralized in a remote location from the DUTs, such as a mainframe rack or console.

As an example of the conventional DRAM-based catchRAM architecture, FIG. 1 illustrates a conventional memory tester 10, including a main console 12 coupled to a testhead 14. The testhead is essentially a housing that surrounds and protects a plurality of sophisticated circuit boards more commonly known as channel or instrument cards 16. Each of the channel cards includes timing, data and formatting circuitry 18, 20 and 22 for interfacing the tester to a plurality of DUTs 23.

Separated from the testhead, the much larger console 12 houses a computer workstation 24 and a plurality of centralized catchRAM DRAM banks 26. The banks each comprise a plurality of SDRAM devices that are interleaved to provide improved performance and burst mode capability. A custom high-speed data link 28 couples the channel card pin electronics 16 to the catchRAM memory in the tester console for high-speed data transmission during test. The console also houses a plurality of redundancy analyzers 30 that analyze the failure data stored by the catchRAM to arrive at possible repair solutions for the failing devices. A repair station 32 disposed in the console employs the repair solution to activate redundant rows/columns in the DUTs.

In operation, the catchRAM 24 is pre-programmed into "slices", such that a portion of the overall memory corresponds to a region of one of the DUTs 23. This may be changed from test to test, thus providing a powerful flexibility feature in terms of the catchRAM capacity. The high-speed link 28 transfers failure information from the testhead channel cards to the corresponding catchRAM "slices" in the tester console, according to the pre-programmed user instructions.

While this construction works well for its intended applications, the high speed link 28 often adds considerable cost to the tester. This is because the link is typically customized to the tester pin electronics and often unavailable as an inexpensive off-the-shelf item. Cost is a significant factor in whether a particular tester achieves widespread market acceptance. Thus, the need exists for a DRAM catchRAM without the cost of a customized high-speed link. The present invention satisfies this need.

SUMMARY OF THE INVENTION

The failure analysis memory of the present invention provides a low cost way to achieve high performance failure analysis in a semiconductor tester. This is accomplished through the use of a distributed catchRAM architecture that employs RLDRAM memory in the testhead channel cards.

To realize the foregoing advantages, the invention in one form comprises a failure analysis memory for use with a semiconductor tester for storing bit image failure information relating to a memory-under-test. The semiconductor tester has a plurality of channel cards disposed proximate the memory-under-test. The failure analysis memory includes a memory controller and a plurality of memory units disposed in communication with the memory controller. The memory units are distributed on the channel cards.

In another form, the invention comprises automatic test equipment for testing semiconductor devices. The automatic test equipment includes a host computer and channel circuitry disposed remotely from the host computer, proximate a device-under-test. A failure analysis memory is disposed locally with the channel circuitry.

In a further form, the invention comprises a method of storing failure information from a memory-under-test, the method including the steps of first detecting failure information from the memory-under-test with a semiconductor tester; distributing the failure information among a plurality of local memory units disposed proximate the memory-under-test; and collecting the failure information from the distributed memory units to produce a bit image representation of the memory-under-test.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The failure analysis memory of the present invention provides a fast, efficient, and inexpensive storage mechanism for failure data, sufficient to carry out a bit image analysis. This is achievable by distributing the failure analysis memory out locally, on the tester channel cards, rather than having the memory centralized in a remote location, such as the tester mainframe. This allows for a more cost-effective failure analysis memory architecture through the omission of conventional customized high-speed links.

Figure 1:
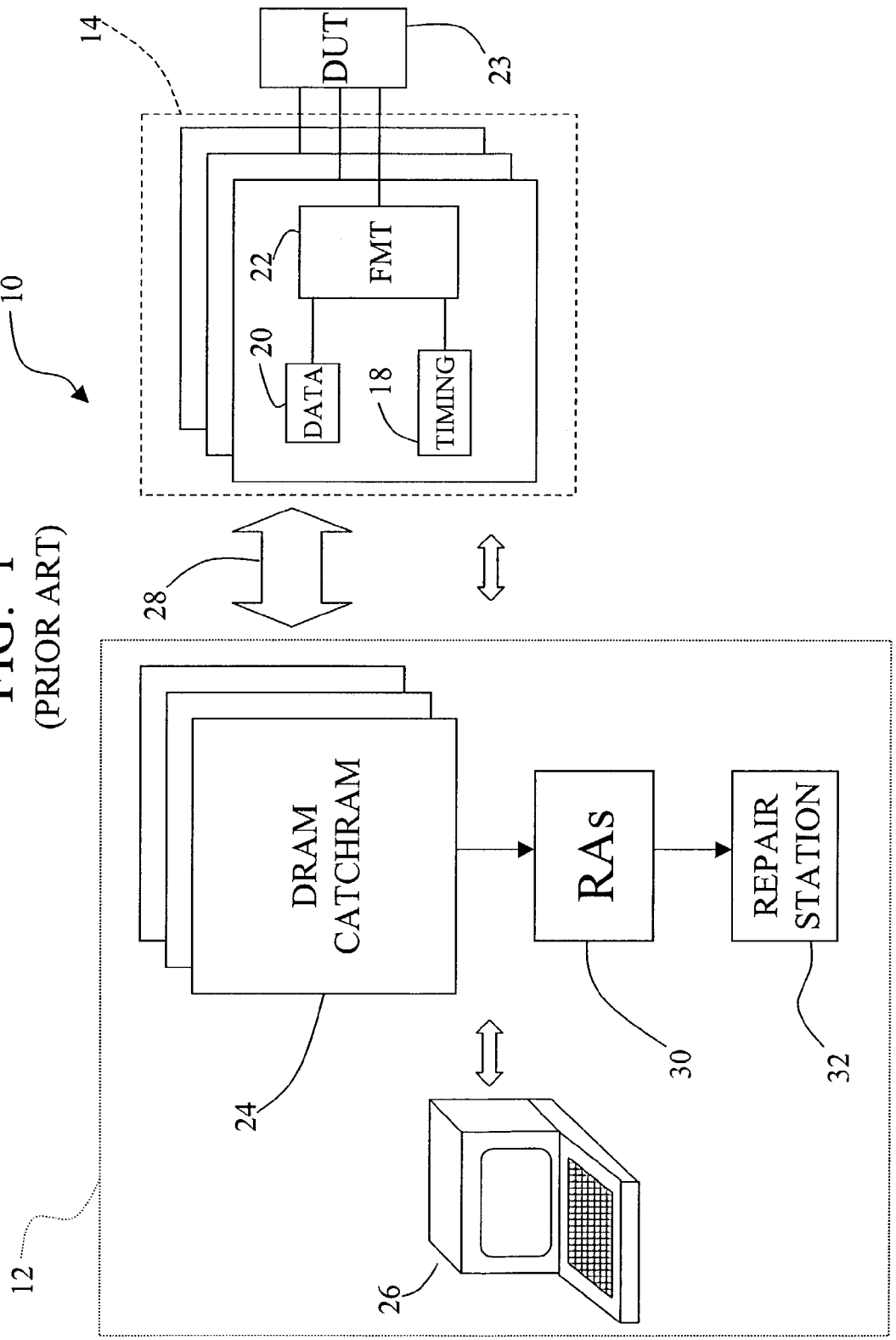
FIG. 1 is a high level block diagram of a conventional semiconductor tester for testing devices that include memory.
Figure 2:
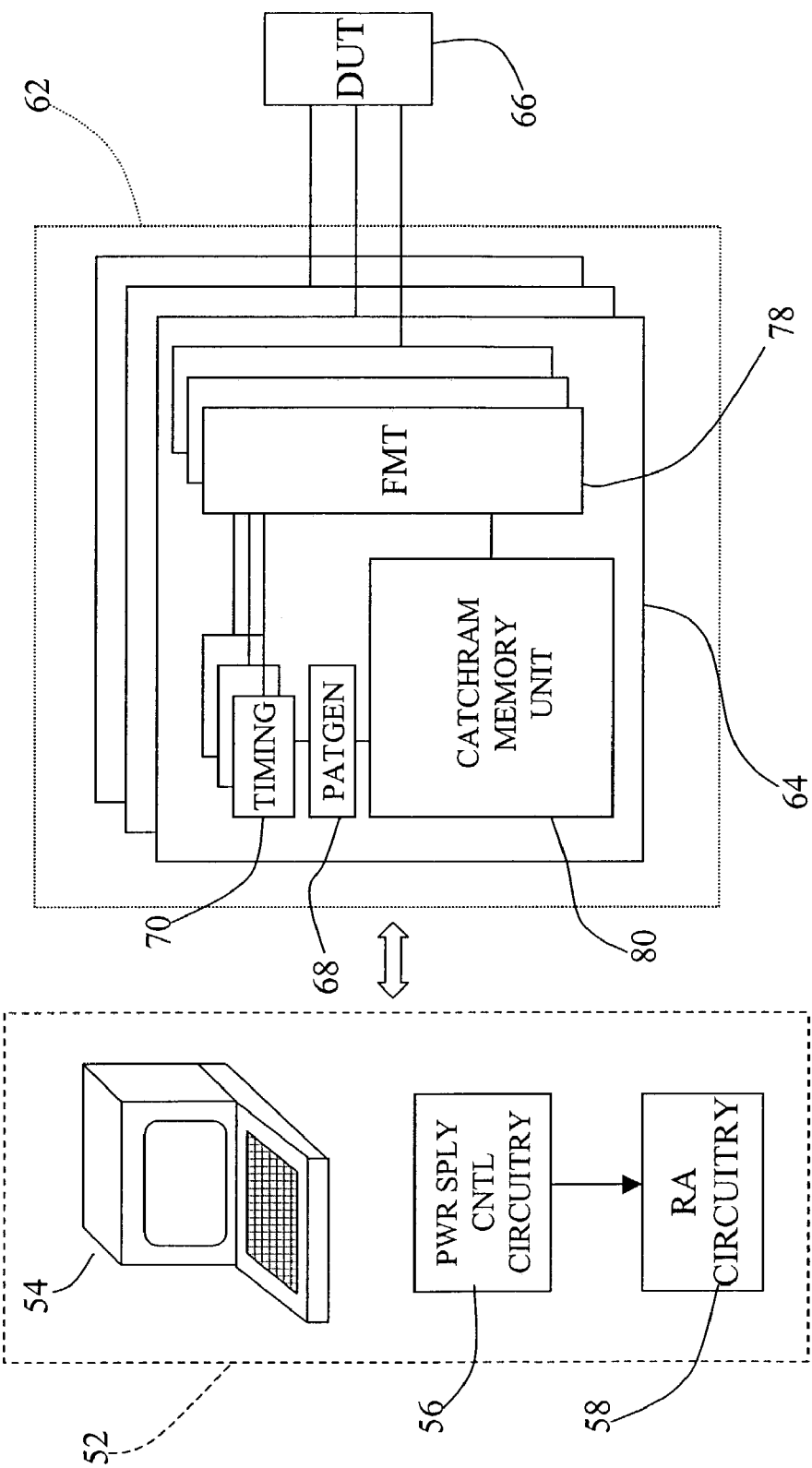
FIG. 2 is a high-level block diagram of a semiconductor tester according to one form of the present invention.

Referring now to FIG. 2, a semiconductor tester according to one form of the present invention, generally designated 50, includes a DC frame 52 and a testhead 62. The DC frame includes a computer workstation 54, power supply control circuitry 56, and redundancy analysis circuitry 58. Off-the-shelf data bus circuitry 60 provides communication between the DC frame circuitry 52 and the testhead 62.

Further referring to FIG. 2, the testhead 62 comprises a housing for interfacing a plurality of channel cards 64 to one or more devices-under-test (DUTs) 66. The testhead is disposed as close to the DUTs as practicable to minimize delays in the signals propagating between the testhead channel cards and the DUTs. Consequently, keeping the size of the testhead small is important in order to maintain the ability of carrying it above the DUTs during test (via the use of a manipulator).

Figure 3:
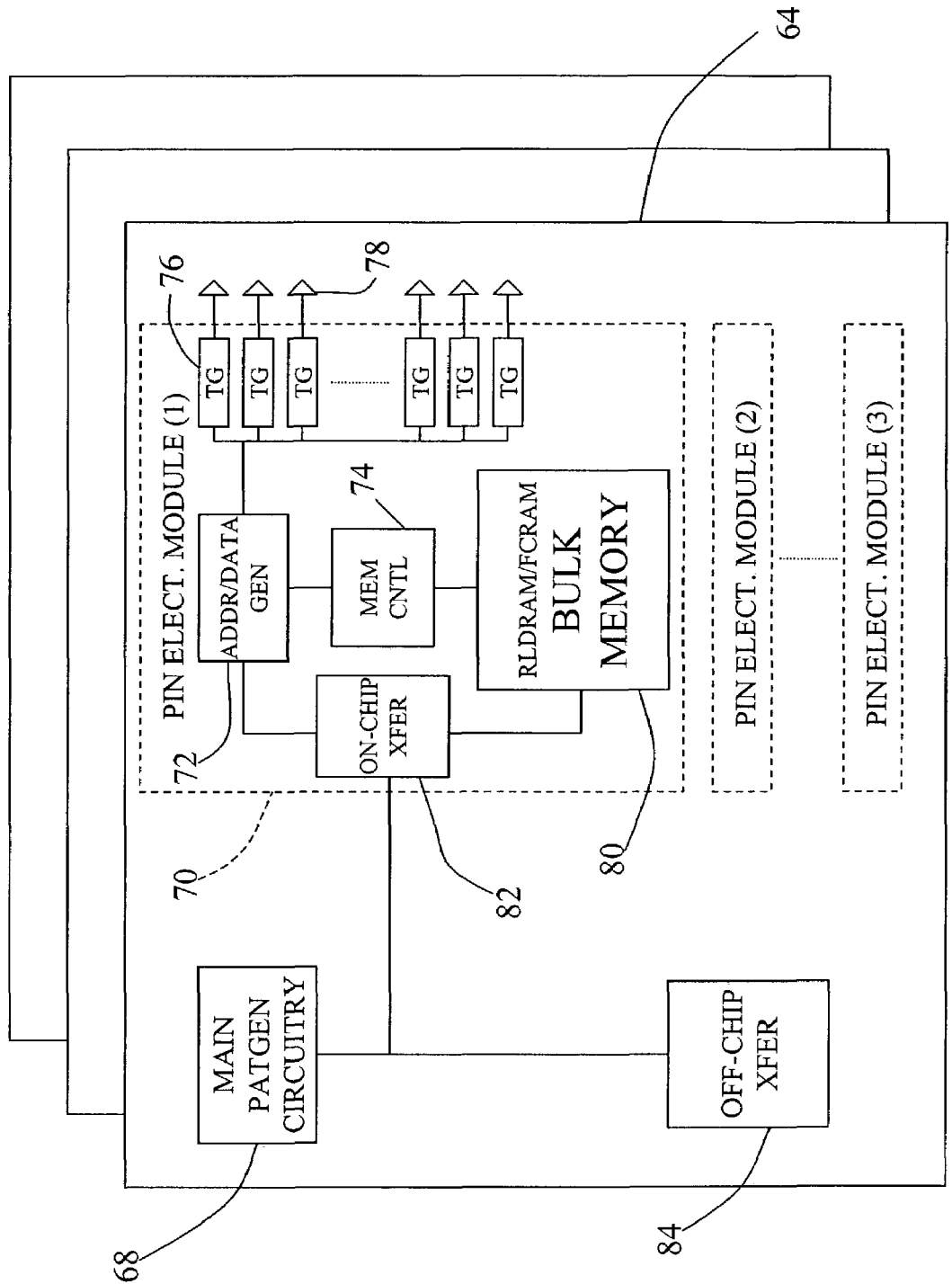
FIG. 3 is a more detailed block diagram of the catchRAM circuitry employed in the semiconductor tester of FIG. 2.

In the present invention, the channel cards 64 are configured to enable the test of memory devices, or logic devices having embedded memory circuitry. Referring to FIGS. 2 and 3, each channel card includes main pattern generation circuitry 68 and a plurality of timing generator modules 70. Each timing generator module includes local memory pattern generation (address/data) circuitry 72 coupled to a memory controller 74 and a plurality of timing generators 76. The timing generators provide precision timing signals to a plurality of driver and comparator circuits 78 that provide the formatting circuitry for interfacing the semiconductor tester 50 to the DUT pins 66.

Further referring to FIG. 3, the memory controller 74 directs the interaction of the local memory pattern generator 72, timing generators 76, and a failure analysis memory unit 80. The local pattern generator provides a hidden transfer capability to augment the main pattern generation circuitry similar to that described in U.S. patent application Ser. No. 09/426,486, previously incorporated herein by reference. In a preferred embodiment, each timing generator module 70 comprises an application specific integrated circuit (ASIC) having electronics sufficient to support sixteen tester channels. Consequently, employing several timing generator modules on a single channel card 64 enables one-hundred-twenty-eight or more channels worth of tester resources per card, if desired.

With reference to FIGS. 3 and 4, each failure analysis memory unit 80 preferably comprises at least one reduced latency DRAM device, such as an RLDRAM or FCRAM device. A single RLDRAM device employs several internal memory banks that may be flexibly configured in different ways. The inventor has discovered that utilizing the internal banking architecture (to be subsequently referred to as "lanes") of these devices advantageously provides performance characteristics similar to multiple SDRAM devices "banked" together (with no internal banking). As a result, a large amount of memory capacity may be realized in a very small area through the use of reduced latency DRAMs. In a preferred embodiment, a five-hundred-twelve megabyte capacity device is employed within each timing generator module 70.

To control the internal banking functionality, the memory controller 74 employs reconcile circuitry (not shown) similar to that described in U.S. patent application Ser. No. 09/426,486, previously incorporated herein by reference. The reconcile circuitry allows for a plurality of banked interleaved DRAMs to utilize the DRAM burst mode feature.

Preferably, the RLDRAM banks serve not only as the memory for the failure analysis memory, but also for a "large vector memory" (LVM), "fail vector memory" (FVM), "subroutine vector memory" (SVM), and the like. This straightforwardly configurable bulk memory architecture is highly advantageous in providing maximum memory flexibility for the ATE user.

Figure 4A:
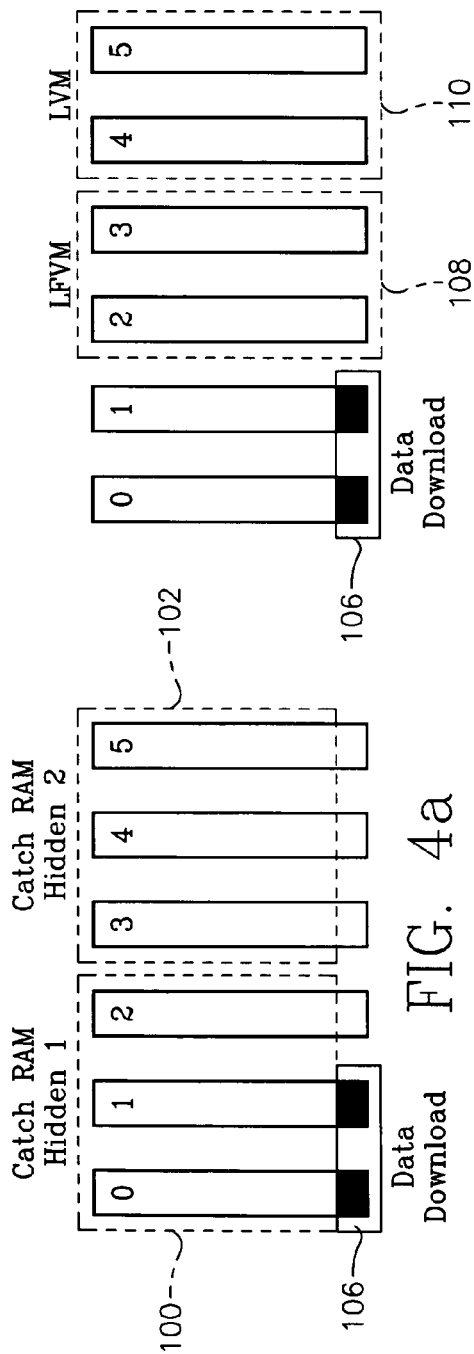
FIGS. 4a through 4c are block diagrams of different potential bulk memory allocations.
Figure 4B:
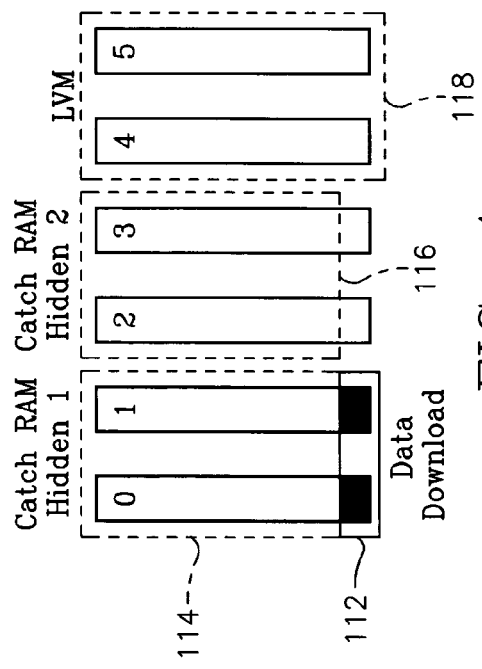
Figure 4C:
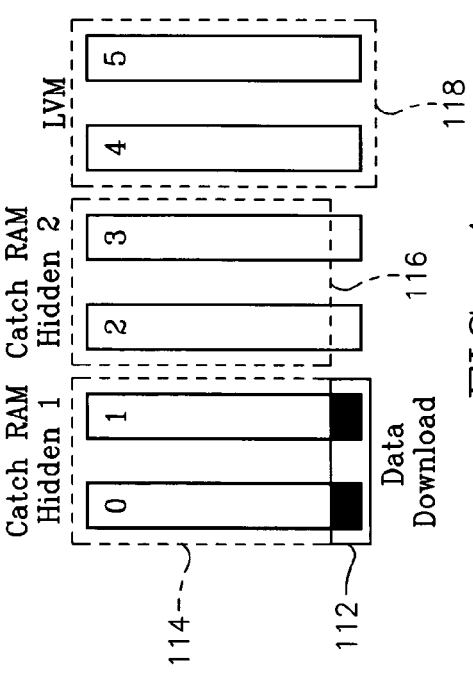

As an example, FIGS. 4a–4c illustrate how the internal "lanes" of an RLDRAM device might be allocated to provide multi-memory functionality for the variety of memories often used for ATE. Lanes can be allocated as catchRAM to capture data and scan data in sequence. One set of lanes 100 can be used to capture test results from the current test, while other lanes 102 can be scanning data out. This allows "hiding" the transfer time behind another test's capture time.

FIG. 4b illustrates a bulk memory allocation scheme for verifying DRAM fuses. In this application, a portion 106 of lanes 0 and 1 are used for data download. Lanes 2 and 3 are set aside as the memory 108 for LFVM Central+Pin data, while lanes 4 and 5 are allocated as the memory 110 for a two-hundred-fifty megahertz LVM. In other words, instead of using the bulk memory as a bit image of the memory under test, it is used as a sequential storage device. In this mode, it captures the raw output of the device, instead of indexing the memory based on the current address of the device. This is often referred to as a capture list.

FIG. 4c shows an allocation that might be employed for logic devices that employ embedded RAMs. While a portion 112 of lanes 0 and 1 are used for data download, the majority of lanes 0 and 1 are allocated to a memory 114 for supporting a first hidden transfer for the catchRAM. Lanes 2 and 3 are allocated to a memory 116 assigned to support a second hidden transfer. The LVM functionality is allocated to a memory portion 118 defined by lanes 4 and 5.

Referring back to FIG. 3, each failure analysis memory unit 80 is coupled to an on-chip transfer circuit 82 that reads data from the memory via commands from the memory controller 74, and transmits the data to an off-chip transfer circuit 84. The off-chip transfer circuit is an off-the-shelf item, preferably in the form of a broadband processor such as model BCM1125H from Broadcom Corporation, Irvine Calif. The off-chip transfer circuit, in turn, communicates with redundancy analysis circuitry 58 disposed in the tester console 52.

Prior to operation, software on the host computer will allocate lanes to functions based on the needs of each individual device. It will allocate these lanes through the standard tester databus circuitry. The end user will not be required to allocate lanes themselves, although they will describe DUT requirements that will be used as an input to the algorithm that allocates lanes.

In operation, the tester drives test signals to, and captures responsive signals from the memory-under-test. The response signals are compared to expected signals. Should mismatches occur between the response signals and the expected signals, failure signals are generated and stored in a location in the catchRAM corresponsing to the DUT memory cell location where the fail occurred. This provides a bit-image failure identification. Since the catchRAM memory banks are distributed throughout the tester channel cards, inside the testhead, the failure data may be captured and stored very quickly and inexpensively.

Once the data is captured and stored, the off-chip transfer circuit 84 will accept a Direct Memory Access from the on-chip transfer circuit 82. The off-chip transfer circuit will then use industry standard network protocols such as IP over industry standard network links such as 1000BaseT Ethernet to transfer the captured data to computers for processing.

Those skilled in the art will recognize the many benefits and advantages afforded by the present invention. Of significant importance is the low cost achievable by eliminating the custom high-speed link and distributing the catchRAM memory locally on each channel card. This, in turn, is enabled by the use of RLDRAM devices that employ an internally banked architecture, thereby reducing the size of the memory required for catchRAM applications.

While the invention has been particularly shown and described with reference to the preferred embodiments thereof, it will be understood by those skilled in the art that various changes in form and detail may be made therein without departing from the spirit and scope of the invention.

What is claimed is:

1. A failure analysis memory system for use with a semiconductor tester for storing bit image failure information relating to a memory-under-test, the semiconductor tester having a plurality of testhead channel cards disposed in a testhead between the workstation and an interface for the memory-under-test, the failure analysis memory system including:
   a memory controller; and
   a plurality of reduced latency DRAM memory units disposed in communication with the memory controller and distributed on the channel cards, the memory controller controlling an internal banking of the plurality of reduced latency DRAM memory units so as to cause each of the plurality of reduced latency DRAM memory units to comprise:
   a data download portion;
   a first hidden transfer portion of catch RAM;
   a second hidden transfer portion of catch RAM; and
   a large vector memory portion.

2. The failure analysis memory system of claim 1, wherein the plurality of reduced latency DRAM memory units comprises one from the group comprising an RLDRAM and an FCRAM.

3. Automatic test equipment for testing semiconductor devices, the automatic test equipment including:
   a host computer;
   a testhead comprising channel circuitry disposed in the testhead between a device-under-test interface and the host computer; and
   a failure analysis memory disposed with the channel circuitry in the testhead, the failure analysis memory comprising a plurality of reduced latency DRAM configured such that each of the plurality of reduced latency DRAM comprises:
   a data download portion;
   a first hidden transfer portion of catch RAM;
   a second hidden transfer portion of catch RAM; and
   a large vector memory portion.

4. The automatic test equipment of claim 3, wherein the failure analysis memory comprises at least one of: (a) RLDRAM, or (b) FCRAM.

5. A configurable distributed memory system for use with a semiconductor tester having a plurality of testhead channel cards disposed in a testhead between the workstation and an interface for a device-under-test, the configurable distributed memory system comprising:
   a) a memory controller; and
   b) a plurality of configurable memory units disposed in communication with the memory controller and distributed on the testhead channel cards, the memory controller being adapted to configure the plurality of memory units to comprise more than one of: (1) catch RAM; (2) large vector memory; (3) fail vector memory; or (4) subroutine vector memory.

6. The configurable distributed memory system of claim 5, wherein the controller is adapted to configure the plurality of configurable memory units to simultaneously comprise more than one of: (1) catch RAM; (2) large vector memory; (3) fail vector memory; and (4) subroutine vector memory.

7. The configurable distributed memory system of claim 5, wherein the controller is adapted to configure a portion of the plurality of configurable memory units as catch RAM and a portion of the plurality of configurable memory units as large vector memory.

8. The configurable distributed memory system of claim 7, wherein the plurality of configurable memory units and the controller are adapted to configure the plurality of configurable memory units to comprise:
   a) a first hidden portion catch RAM;
   b) a second hidden portion catch RAM; and
   c) large vector memory portion.

9. The configurable distributed memory system of claim 5, wherein the plurality of configurable memory units and the controller are adapted to configure the plurality of configurable memory units to comprise catch RAM.

10. The configurable distributed memory system of claim 9, wherein the plurality of configurable memory units and the controller are adapted to index stored memory based on a current address of the device under test.

11. The configurable distributed memory system of claim 5, wherein the plurality of configurable memory units and the controller are adapted to configure the plurality of configurable memory units to comprise large vector memory.

12. The configurable distributed memory system of claim 11, wherein the plurality of configurable memory units and the controller are adapted to configure the plurality of configurable memory units such that the plurality of configurable memory are sequential storage devices so as to provide a capture list.

13. The configurable distributed memory system of claim 5, wherein the plurality of configurable memory comprise reduced latency DRAM.

14. The configurable distributed memory system of claim 13 wherein the plurality of configurable memory comprise at least one of: (a) RLDRAM, or (b) FCRAM.

* * * * *